US007518832B2

(12) United States Patent
Suzuki (10) Patent No.: US 7,518,832 B2
(45) Date of Patent: Apr. 14, 2009

(54) COIL ASSEMBLY, HEAD SUSPENSION ASSEMBLY, DISK DEVICE, AND METHOD OF MANUFACTURING HEAD SUSPENSION ASSEMBLY

(75) Inventor: Akitoshi Suzuki, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 413 days.

(21) Appl. No.: 11/413,212

(22) Filed: Apr. 28, 2006

(65) Prior Publication Data
US 2006/0246748 A1 Nov. 2, 2006

(30) Foreign Application Priority Data
Apr. 28, 2005 (JP) ............... 2005-133604

(51) Int. Cl.
*G11B 5/55* (2006.01)
(52) U.S. Cl. ................... 360/264.2; 360/265.7
(58) Field of Classification Search .............. 360/264.2, 360/264.7, 265.7
See application file for complete search history.

(56) References Cited

U.S. PATENT DOCUMENTS

| 6,771,470 | B1 | 8/2004 | Yagi | |
|---|---|---|---|---|
| 2003/0123193 | A1 | 7/2003 | Yamada | |
| 2004/0160701 | A1 | 8/2004 | Yagi | |
| 2004/0240119 | A1* | 12/2004 | Nakamura et al. | 360/264.2 |
| 2005/0011065 | A1 | 1/2005 | Zhang et al. | |
| 2005/0013055 | A1* | 1/2005 | Ho et al. | 360/264.2 |
| 2005/0018357 | A1* | 1/2005 | Hashi et al. | 360/264.2 |
| 2005/0068682 | A1* | 3/2005 | Sasaki | 360/264.7 |
| 2006/0119987 | A1* | 6/2006 | Wong et al. | 360/264.2 |
| 2006/0146447 | A1* | 7/2006 | Ho et al. | 360/264.2 |

FOREIGN PATENT DOCUMENTS

| JP | 05-258547 | 10/1993 |
|---|---|---|
| JP | 09-180380 | 7/1997 |
| JP | 10-092125 | 4/1998 |
| JP | 2001-143246 | 5/2001 |
| JP | 2002-245732 | 8/2002 |
| WO | WO 01/63610 A1 | 8/2001 |

OTHER PUBLICATIONS

Singapore Search Report dated Apr. 17, 2007 for Appln. No. 200602423-6.

* cited by examiner

*Primary Examiner*—Tianjie Chen
(74) *Attorney, Agent, or Firm*—Pillsbury Winthrop Shaw Pittman, LLP (57) ABSTRACT

A coil assembly of a disk device includes a support frame on which a voice coil is fixed and a board unit connected to the support frame. The board unit has a main FPC extending from a base portion and a connecting portion extending from one side of an extended end portion of the main FPC. The connecting portion comprises a first connecting portion which extends in a longitudinal direction of the main FPC and has a plurality of first connection pads, a junction portion extending from the first connecting portion, and a second connecting portion which extends in the longitudinal direction of the main FPC from the junction portion and has a plurality of second connection pads. The first and second connecting portions are fixed to first and second support surfaces, respectively, of the support frame.

13 Claims, 11 Drawing Sheets

COIL ASSEMBLY, HEAD SUSPENSION ASSEMBLY, DISK DEVICE, AND METHOD OF MANUFACTURING HEAD SUSPENSION ASSEMBLY

CROSS-REFERENCE TO RELATED APPLICATIONS

This application is based upon and claims the benefit of priority from Japanese Patent Application No. 2005-133604, filed Apr. 28, 2005, the entire contents of which are incorporated herein by reference.

BACKGROUND

1. Field

One embodiment of the invention relates to a coil assembly used in a disk device having a disk for use as a recording medium, a head suspension assembly provided with the coil assembly, a disk device, and a method of manufacturing a head suspension assembly.

2. Description of the Related Art

In recent years, disk devices, such as magnetic disk devices, optical disk devices, etc., have been widely used as external recording devices of computers or image recording devices.

A disk device, e.g., a magnetic disk device, generally comprises a magnetic disk, a spindle motor that supports and rotates the disk, a head actuator that supports a magnetic head, a voice coil motor for driving the head actuator, a circuit board unit, etc., which are arranged in a case The head actuator includes a bearing portion attached to the case and a plurality of arms stacked on and extending from the bearing portion. A magnetic head is attached to each arm by means of a suspension. The circuit board unit is formed integrally having a base portion and a main flexible printed circuit board (hereinafter, referred to as a main FPC). A head IC, connector, etc. are mounted on the circuit board unit. The main FPC extends close to the bearing portion from the base portion. An extended end portion of the main FPC includes a plurality of connecting portions. Each connecting portion is provided with a plurality of connection pads and a through hole through which a screw is passed. The connecting portion is fastened to the bearing portion of the head actuator by the screw that is passed through the through hole.

Further, a relay flexible printed circuit board (relay FPC) is fixed on each arm and each suspension of the head actuator. One end of the relay FPC is connected to the magnetic head, while the other end is connected to its corresponding connecting portion of the main FPC. The other end of each relay FPC is provided with a plurality of connection pads. As these connection pads are soldered individually to the connection pads of each connecting portion of the main FPC, the relay FPC and the main FPC are connected electrically and mechanically to each other. The magnetic head supported on each suspension is connected electrically to the circuit board unit through the relay FPC and the main FPC.

When the magnetic disk is rotating, in the magnetic disk device constructed in this manner, the magnetic head is moved to and located in a desired radial position on the disk, that is, on a desired track, by the head actuator. Information is written to and read from the disk by the head.

Recently, with the miniaturization of disk devices, individual components, such as head actuators, have been reduced in size. For the small-sized head actuators of this type, it is hard to secure a space in which connecting portions of a main FPC are screwed to a bearing portion. Besides, a space for connection work is too narrow to ensure high operating efficiency. Proposed in Jpn. Pat. Appln. KOKAI Publication No. 10-092125, therefore, is a method in which connecting portions of a main FPC are fixed by being interposed in a bearing portion of a head actuator without using screws, for example. According to this method, however, the connecting portions of the main FPC and connecting portions of a relay FPC must be soldered to one another, so that the connection work is troublesome and requires skill.

Proposed in Jpn. Pat. Appln. KOKAI Publication No. 2001-143246, for example, is a head actuator in which connecting portions of a main FPC and connecting portions of a relay FPC are joined together at a junction between a suspension and an arm, and they are pressure-bonded together by fixing a fixing plate to them by caulking from above.

Normally, the connecting portions of the main FPC extend in opposite directions from the opposite sides of an extended end of the main FPC. These connecting portions are bent at right angles and connected to the relay FPC. Described in Jpn. Pat. Appln. KOKAI Publication No. 2002-245732 is an arrangement in which an arm is assembled to a bearing portion after connecting portions of a main FPC are previously soldered to connection wiring on a suspension.

According to the head actuator described in Jpn. Pat. Appln. KOKAI Publication No. 2001-143246, the main FPC and the relay FPC need not be soldered to each other. It is difficult, however, to align the connecting portions accurately with one another, so that the reliability lowers. Since the fixing plate is fixed by caulking, moreover, disassembling the junction is too hard to repair the head actuator with ease.

According to the head actuator described in Jpn. Pat. Appln. KOKAI Publication No. 2002-245732, operation is troublesome because two arms and suspensions on which magnetic heads are mounted must be handled together with a board unit that has the main FPC. It is hard to make a space between the connecting portions that extend in the opposite directions from the main FPC narrower than the width of the main FPC, which hinders miniaturization of the head actuator.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a coil assembly comprises: a support frame which has a first support surface and a second support surface opposed to each other and on which a voice coil is fixed; and a board unit having a base portion on which an electronic component is mounted, a belt-shaped main flexible printed circuit board extending from the base portion, and a connecting portion extending from one side of an extended end portion of the main flexible printed circuit board. The connecting portion includes a first connecting portion which extends in a longitudinal direction of the main flexible printed circuit board and has a plurality of first connection pads arranged in the longitudinal direction, a junction portion extending from the first connecting portion, and a second connecting portion which extends in the longitudinal direction of the main flexible printed circuit board from the junction portion and has a plurality of second connection pads arranged in the longitudinal direction, the first connecting portion being fixed to the first support surface of the support frame, and the second connecting portion being folded back at the junction portion and fixed to the second support surface of the support frame.

A hard disk drive (HDD) according to an embodiment of this invention will now be described in detail with reference to the accompanying drawings.

Figure 1:
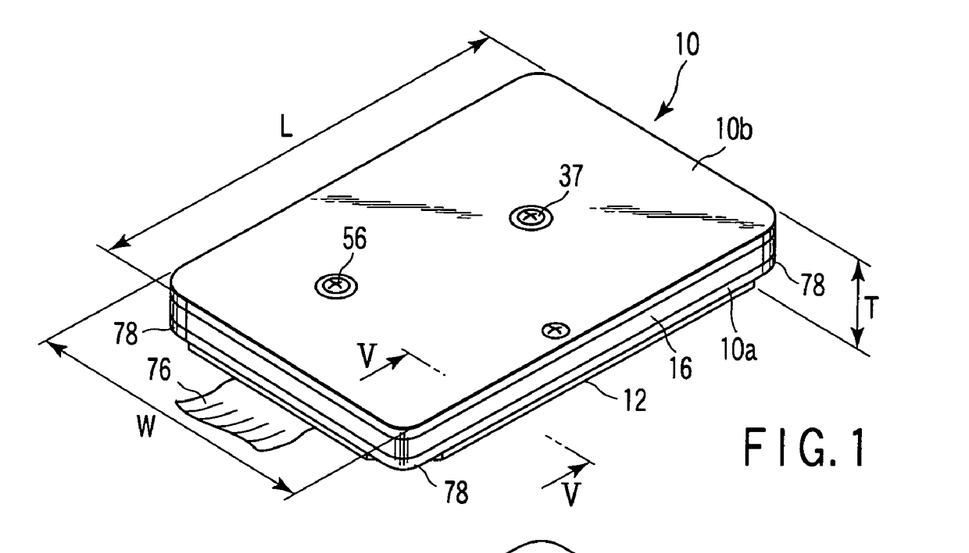
FIG. 1 is a perspective view showing a hard disk drive (hereinafter, referred to as an HDD) according to an embodiment of the invention.
Figure 2:
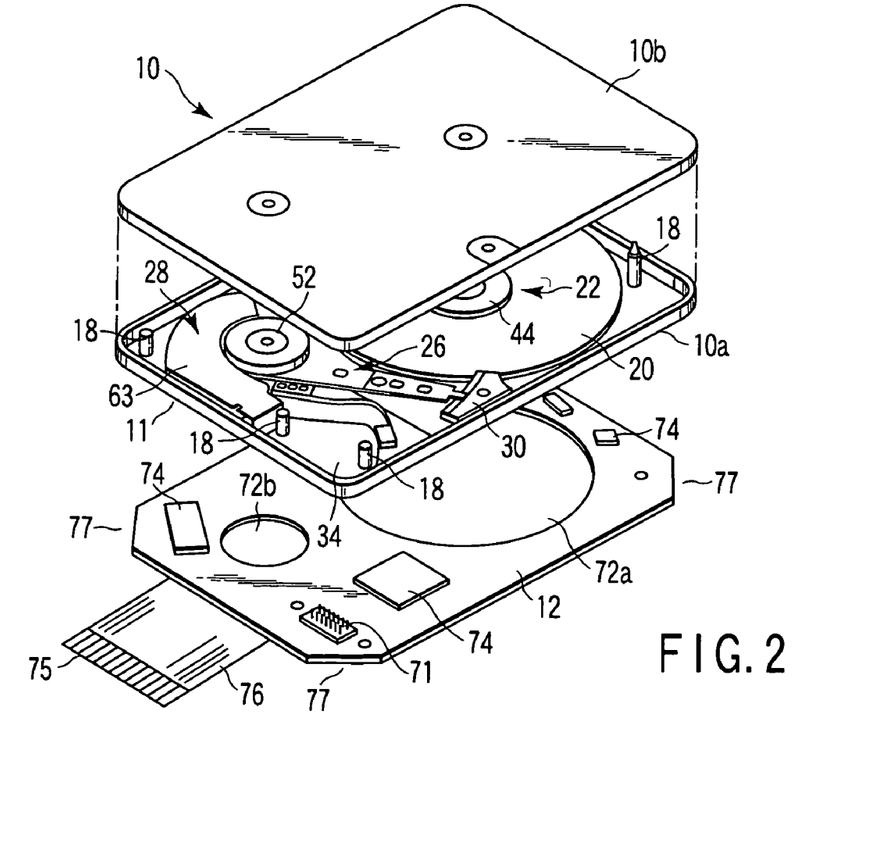
FIG. 2 is an exploded perspective view of the HDD.

As shown in FIGS. 1 and 2, the HDD comprises a case 10 substantially in the form of a rectangular box, which contains various members (mentioned later), and a rectangular control circuit board 12 overlapped on the outer surface of the case 10. The case 10 and the circuit board 12 are formed so that their length L and width W are 32 mm and 24 mm, respectively, and that a thickness T of a resultant structure that includes them ranges from 3 to 6 mm, for example. The thickness T is set to, for example, about 3.3 mm or 5 mm, depending on the number of disks to be stored in the structure.

As shown in FIGS. 2 to 5, the case 10 has a first shell 10a and a second shell 10b, which are substantially equal in dimensions. Each of the shells 10a and 10b is a substantially rectangular structure of metal, having side walls on its peripheral edge portion. The first and second shells 10a and 10b are located opposite each other so that their respective peripheral edge portions face each other. A belt-shaped sealing member 16 is wound around the peripheral edge portions of the shells 10a and 10b, and it connects them and seals a gap between them. These elements constitute the case 10 in the form of a rectangular box.

A bottom surface of the first shell 10a forms a rectangular mounting surface 11. Four corners of the case 10 including the corners of the mounting surface 11 are rounded in a circular arc each. Thus, the sealing member 16 that is wound around the peripheral edge portion of the case 10 is prevented from being damaged by the corners of the case. Besides, the gastightness is prevented from being worsened by loosening of the sealing member.

In the case 10, a plurality of support posts 18 are arranged along the peripheral edge portion of the case. Each post 18 has a proximal end fixed to the inner surface of the first shell 10a and is set substantially upright on the inner surface of the first shell. In a position corresponding to each support post 18, a threaded hole is formed in the mounting surface 11 and extends into the post.

Figure 4:
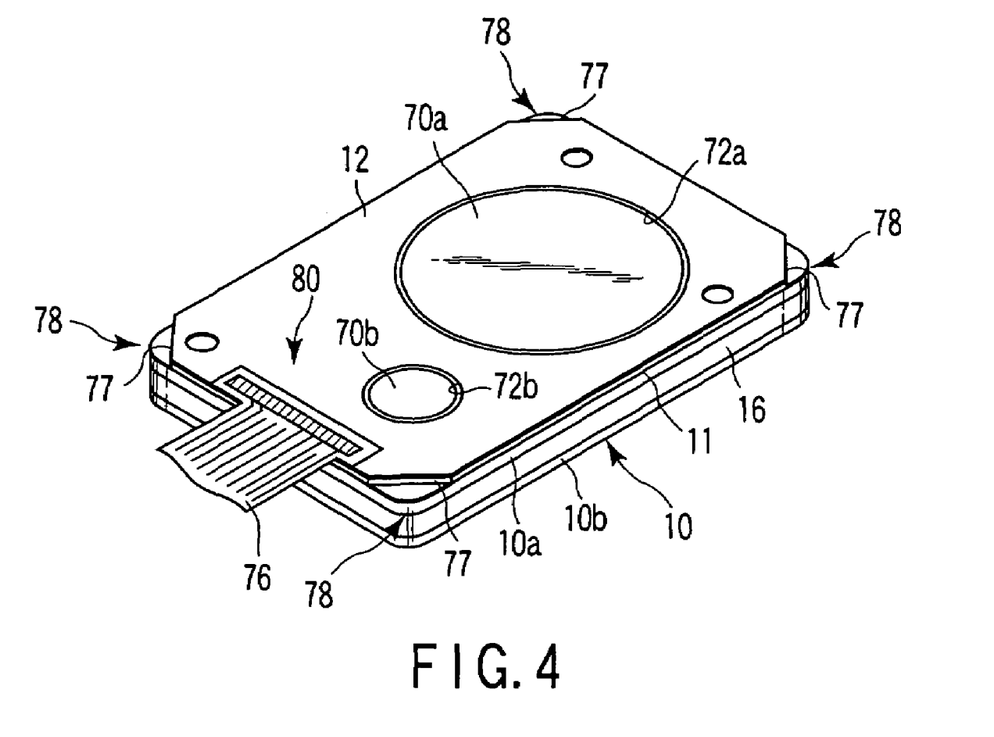
FIG. 4 is a perspective view showing the control circuit board side of the HDD.

As shown in FIGS. 2 and 4, the control circuit board 12, which is formed of a printed circuit board, is a rectangular structure that is substantially equal to the mounting surface 11 of the case 10 in length and width. The mounting surface 11 is formed having circular protuberances 70a and 70b corresponding to a spindle motor 22 and a bearing assembly 52, respectively. The control circuit board 12 is formed with circular openings 72a and 72b corresponding to the protuberances 70a and 70b, respectively. Four corner portions of the control circuit board 12 are diagonally cut at, for example, 45 degrees to each side, thereby forming notch portions 77, individually.

A plurality of electronic components 74 and a connector 71 are mounted on the inner surface of the control circuit board 12 that faces the case 10. The circuit board 12 is connected with a flexible printed circuit board 76 for electrically connecting the HDD to an external device. The printed circuit board 76 is led out through a short side of the control circuit board. A plurality of connection terminals 75 are provided on an extended end of the circuit board 76.

The control circuit board 12 formed in this manner is mounted on the mounting surface 11 of the case 10 and fixed to the first shell 10a by screws. The circuit board 12 is located with its four sides aligned individually with four sides of the mounting surface 11. The protuberances 70a and 70b on the mounting surface 11 are located in the openings 72a and 72b, respectively, of the circuit board 12. The connector 71 on the circuit board 12 is connected to a connector 34c of a board unit 34, which will be described later.

The notch portions 77 at the four corners of the control circuit board 12 are situated individually at the four corner portions of the mounting surface 11. Thus, the four corner portions of the mounting surface 11 are exposed to the outside without being covered by the circuit board 12. The corner portions of the case 10 including the four exposed corner portions of the mounting surface 11 individually constitute retaining portions 78 for retaining the case without touching the circuit board 12.

Figure 3:
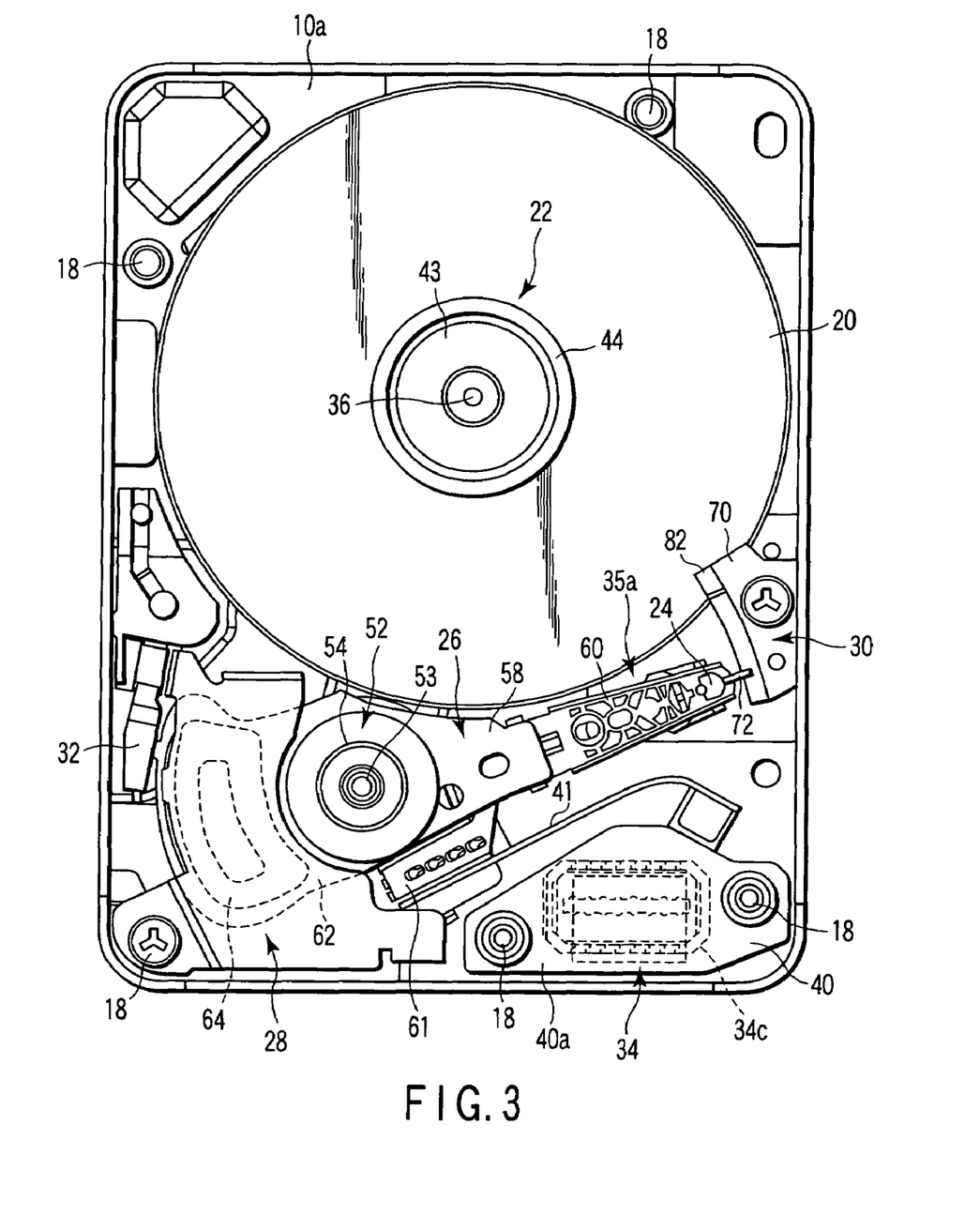
FIG. 3 is a plan view showing a case of the HDD and an internal structure.

In the case 10 are arranged a magnetic disk 20 of, e.g., 0.85-inch diameter, which serves as an information recording medium, the spindle motor 22 for use as a drive motor that supports and rotates the disk, magnetic heads 24, and a head suspension assembly (hereinafter, referred to as an HSA) 26. The magnetic heads 24 are used to write and read information to and from the magnetic disk 20. The HSA 26 supports the magnetic heads for movement with respect to the disk. The case 10 further contains a voice coil motor (hereinafter, referred to as a VCM) 28, a ramp load mechanism 30, a solenoid latch 32, the board unit 34, etc. The VCM 28 serves to rock and position the HSA. The ramp load mechanism 30 unloads into and holds the magnetic heads in a position off the magnetic disk when the heads are moved to the peripheral edge portion of the disk. The solenoid latch 32 holds the HSA in a retreated position. The board unit 34 has a head amplifier and the like.

Figure 5:
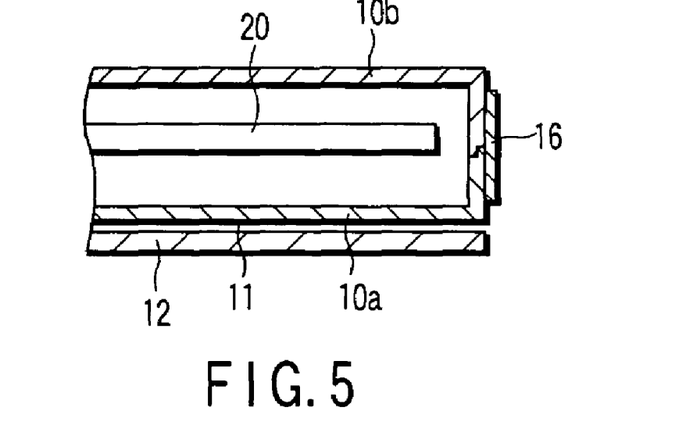
FIG. 5 is a sectional view of the HDD taken along line V-V of FIG. 1.

The spindle motor 22 is mounted on the first shell 10a. The motor 22 has a pivot 36, which is fixed and set substantially upright on the inner surface of the first shell 10a. An extended end of the pivot 36 is fixed to the second shell 10b by a fixing screw 37 that is screwed in from outside the second shell. Thus, the pivot 36 is supported by the first and second shells 10a and 10b from both sides.

A rotor is rotatably supported on the pivot 36 with the aid of a bearing (not shown). That end portion of the rotor on the side of the second shell 10b constitutes a columnar hub 43, on which the magnetic disk 20 is fitted coaxially. An annular clamp ring 44 is fitted on an end portion of the hub 43 and holds the circumferential edge portion of the disk 20. Thus, the disk 20 is fixed to the rotor and supported for integral rotation with the rotor.

An annular permanent magnet (not shown) is fixed on that end portion of the rotor on the side of the first shell 10a and is situated coaxially with the rotor. The spindle motor 22 has a stator core attached to the first shell 10a and coils wound around the core. The stator core and the coils are arranged outside the permanent magnet with gaps between them.

As shown in FIGS. 3, 6, 7 and 8, the HSA 26 is provided with the bearing assembly 52, a coil assembly 50, and first and second head gimbals assemblies (HGAs) 35a and 35b. The bearing assembly 52 is fixed on the inner surface of the first shell 10a. The coil assembly 50 has a support frame 62 that is mounted on the bearing assembly. The HGAs 35a and 35b are supported on the bearing assembly. The bearing assembly 52, which serves as a bearing portion, has a pivot 53 that is set upright on the inner surface of the first shell 10a and a cylindrical hub 54 that is rotatably supported on the pivot 53 by a pair of bearings. An extended end of the pivot 53 is fixed to the second shell 10b by a fixing screw 56 (see FIG. 1) that is screwed in from outside the second shell. Thus, the pivot 36 is supported by the first and second shells 10a and 10b from both sides.

Figure 6:
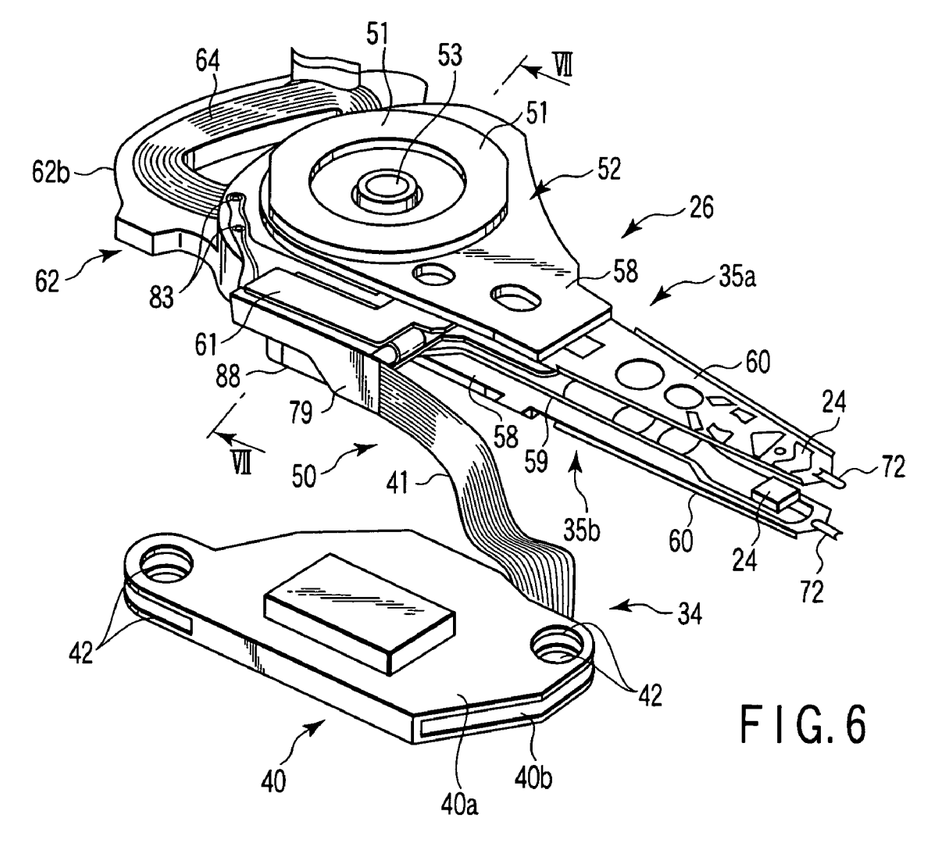
FIG. 6 is a perspective view showing a head suspension assembly of the HDD.
Figure 7:
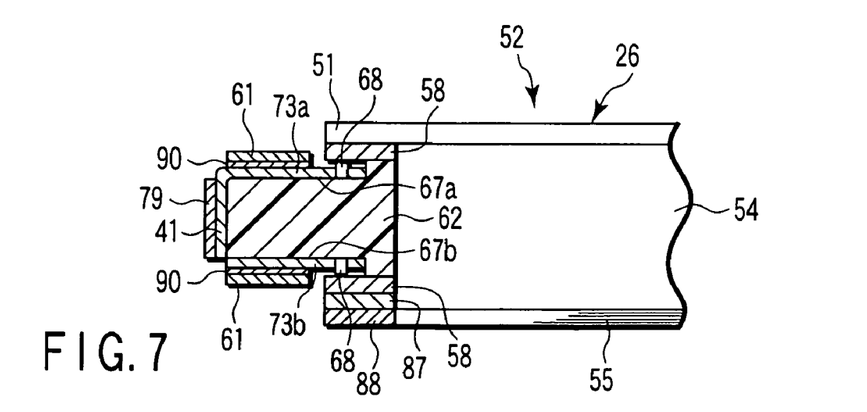
FIG. 7 is a sectional view taken along line VII-VII of FIG. 6 and showing a bearing portion and a connecting portion of the head suspension assembly.
Figure 8:
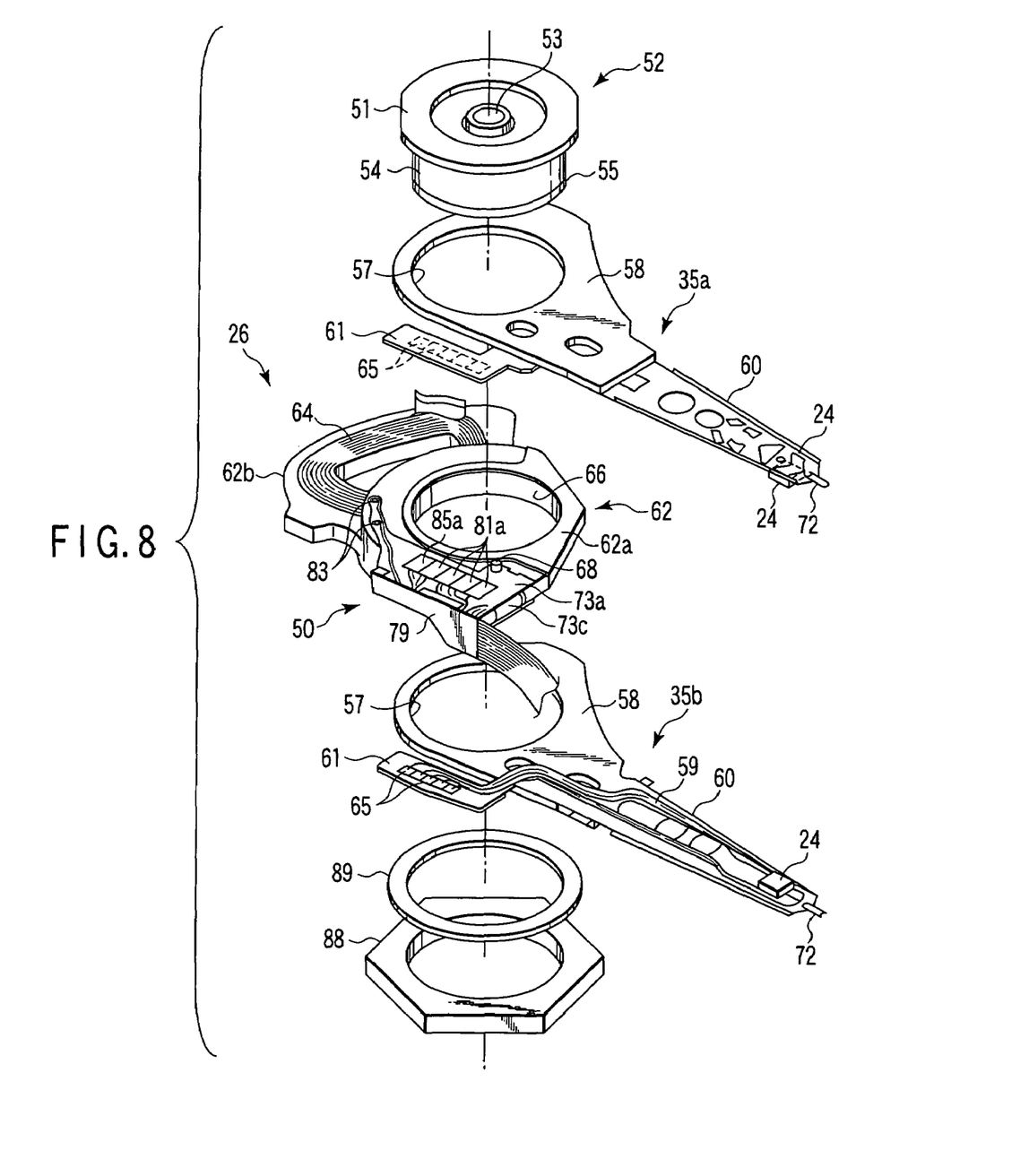
FIG. 8 is an exploded perspective view showing the head suspension assembly.

An annular flange 51 is formed on the upper end of the hub 54, and a threaded portion 55 is formed around the lower end portion of the hub. The bearing assembly 52 is located side by side with the spindle motor 22 in the longitudinal direction of the case 10.

Each of the HGAs 35a and 35b is provided with an arm 58 mounted on the hub 54, a suspension 60 extending from the arm, and a magnetic head 24 that is supported on an extended end of the suspension by a gimbals portion (not shown). The arm 58 is a thin flat plate of about 200-μm thickness that is formed of a stainless steel-based material, such as SUS-304. A circular through hole 57 through which the hub 54 is passed is formed in one end or proximal end portion of the arm 58.

The suspension 60 is formed of an elongated plate spring with a plate thickness of 20 to 100 μm, and its proximal end is fixed to the distal end of the arm 58 by spot welding or adhesive bonding and extends from the arm. The suspension 60 and the arm 58 may be integrally formed of the same material.

The magnetic head 24 has a rectangular slider (not shown) and an MR (magnetic resistance) head for recording and reproduction formed on the slider, and is fixed to the gimbals portion formed on the distal end portion of the suspension 60. The magnetic head 24 has four electrodes (not shown). A given head load that is directed toward a surface of the magnetic disk 20 is applied to the magnetic head 24 by the spring force of the suspension 60.

As shown in FIGS. 6 and 8, each magnetic head 24 is connected electrically to a main FPC 41 (mentioned later) through a relay FPC 59. The relay FPC 59 is pasted on the respective inner surfaces of the arm 58 and the suspension 60 and extends from the distal end of the suspension and the proximal end portion of the arm. The relay FPC 59 is in the form of an elongate belt as a whole, and its distal end is connected electrically to the magnetic head 24. The other end portion of the relay FPC 59 is bent like a crank and extends from the proximal end portion of the arm 58 to the outside of the one end, thus constituting a connecting end portion 61. Connection pads 65 are formed on the connecting end portion 61 and arranged side by side in the longitudinal direction of the connecting end portion. The connecting end portion 61 extends parallel to the inner surface of the arm 58, and the connection pads 65 are provided on the surface opposite from the arm 58.

As shown in FIGS. 6 to 10, the coil assembly 50 of the HSA 26 is provided with the support frame 62 and the board unit 34 connected to the support frame. The support frame 62 has an annular body 62a formed with a through hole 66 through which the hub 54 is passed and a frame portion 62b extending from the body in the direction opposite from the arm 58. It is integrally molded from a synthetic resin or the like. A voice coil 64 that constitutes a part of the VCM 28 is embedded in the frame portion 62b.

Figure 10:
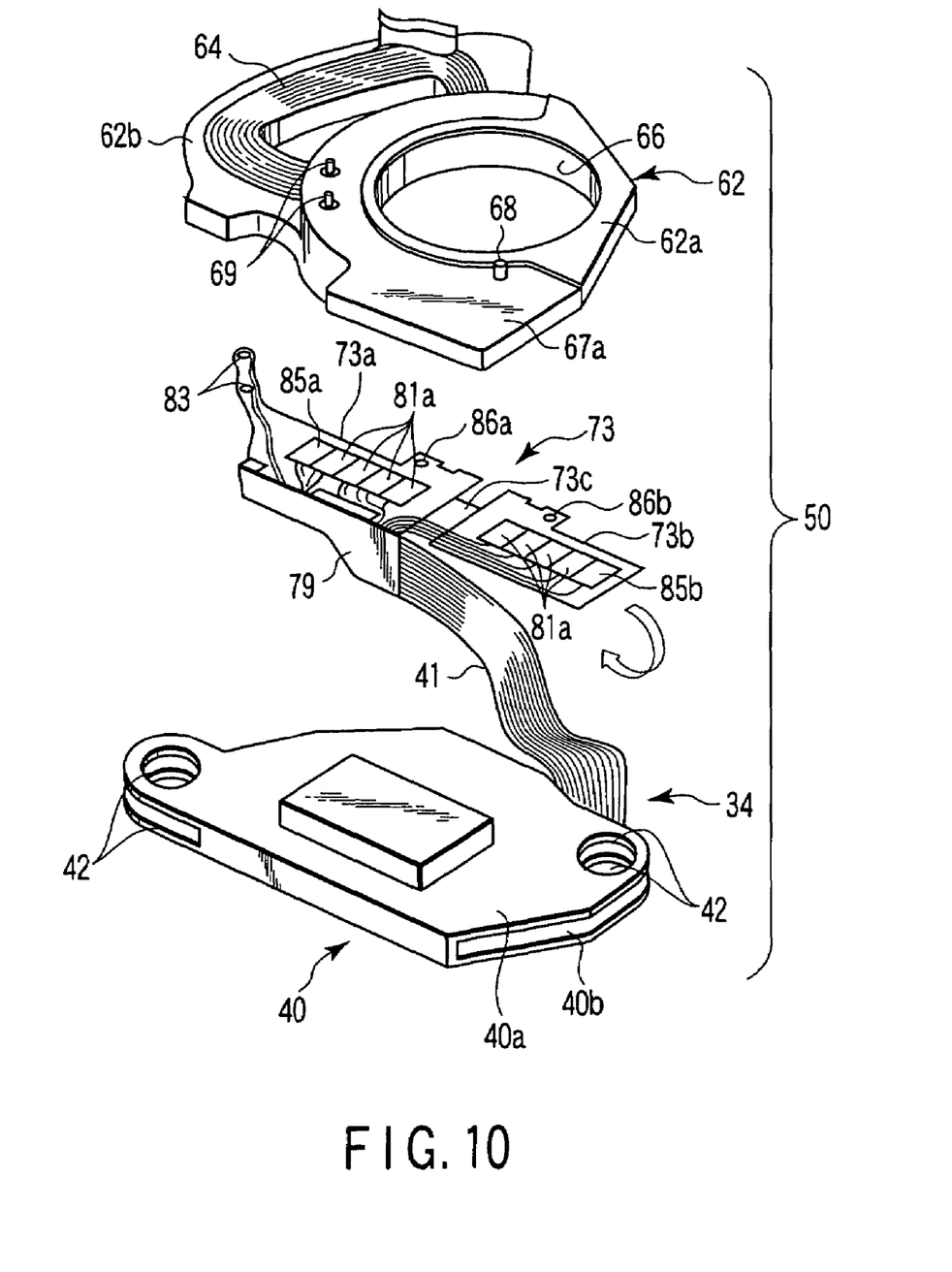
FIG. 10 is an exploded perspective view showing the coil assembly.

Beside the through hole 66, as shown in FIGS. 7 and 10, a flat first support surface 67a is formed on one surface of the body 62a, and a flat second support surface 67b on the other surface. The first and second support surfaces 67a and 67b are situated opposite each other. A positioning protrusion 68 is formed integrally on each of the support surfaces 67a and 67b. On the side of the first support surface 67a, moreover, a pair of coil connection terminals 69 that are connected electrically to the voice coil 64 are located on the surface of the body 62a.

As shown in FIGS. 6 to 11, the board unit 34 has a board body 40 and the main FPC 41. The board body 40 is integrally formed of a common flexible printed circuit board, and the main FPC 41 extends from the board body. The board body 40 has a base portion 40a and a cover portion 40b that have substantially the same shape. Through holes 42 through which the support posts 18 are to be passed are formed in the respective opposite end portions of the base portion 40a and the cover portion 40b.

Figure 11:
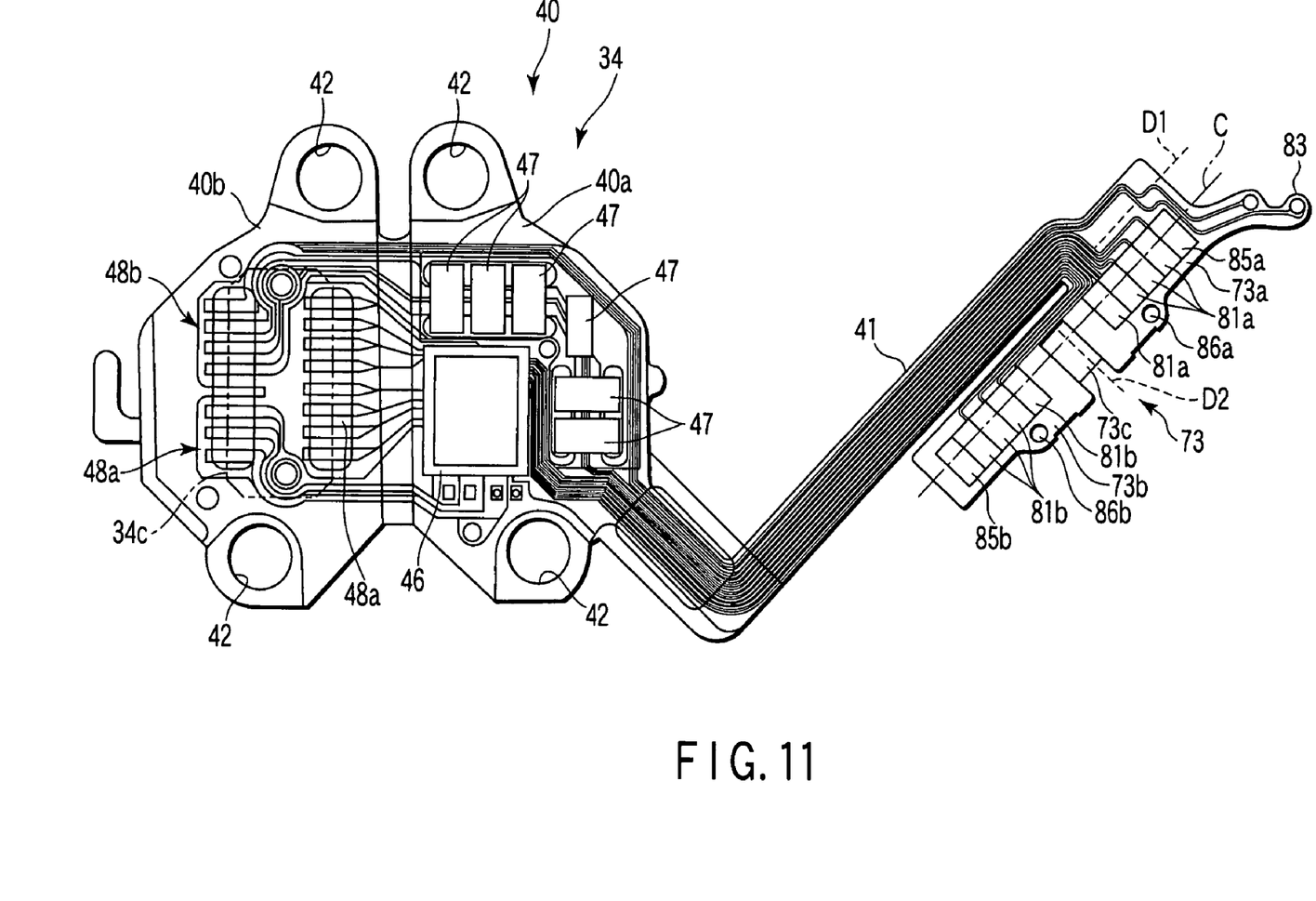
FIG. 11 is a plan view showing a development of a board unit of the coil assembly.

A head amplifier 46 and a plurality of, for example, six capacitors 47 for retraction are mounted on the inner surface of the base portion 40a. The head amplifier 46 is formed of a substantially rectangular bear chip. Each capacitor 47 is formed of a rectangular tantalum capacitor, for example, and it is taller than the head amplifier 46. The six capacitors 47 are arranged around the head amplifier 46. They serve as capacitors for so-called retraction, which stores electric charge during the operation of the HDD. When the power is tuned on, the stored charge drives a head actuator to move the magnetic head 24 to its retreated position.

Connection terminals 48a that are individually connected to the head amplifier 46 and connecting terminals 48b connected to the capacitor 47 are provided on the cover portion 40b of the board body 40. Overlying the connecting terminals 48a and 48b, the connector 34c is mounted on the cover portion 40b and connected to the connecting terminals.

The cover portion 40b is folded back and opposed back to back to the base portion 40a. The board body 40 is fixed in a predetermined position such that the support posts 18 are passed individually through the through holes 42 with the cover portion side located on the inner surface of the first shell 10a. The connector 34c is exposed to the mounting surface 11 of the first shell 10a through an opening in the first shell.

As shown in FIGS. 10 and 11, the belt-shaped main FPC 41 extends from the base portion 40a and is provided integrally with a connecting portion 73, which extends from one side of its extended end portion. A reinforcement plate 79 is pasted on the outer surface of the extended end portion. The connecting portion 73 has substantially rectangular first and second connecting portions 73a and 73b and a junction portion 73c. The first connecting portion 73a extends in the longitudinal direction of the main FPC 41 toward the base portion 40a. The junction portion 73c extends from the first connecting portion toward the base portion 40a. The second connecting portion 73b extends in the longitudinal direction of the main FPC from the junction portion toward the base portion 40a.

A plurality of, for example, four first connection pads 81a are provided on the first connecting portion 73a and arranged side by side in the longitudinal direction of the first connecting portion. The first connecting portion 73a is provided with a pair of coil connection pads 83 that are situated off an extension C of a line on which the first connection pads 81a are arranged. The junction portion 73c is provided on the opposite side of the first connection pads 81a from the coil connection pads 83. A ground pad 85a is provided between the first connection pads 81a and the coil connection pads 83 so as to be situated on the extension C. The first connecting portion 73a has a positioning hole 86a that is situated off the extension C of the line on which the first connection pads 81a are arranged and constitutes a first positioning portion. The first connection pads 81a, ground pad 85a, and coil connection pads 83 are connected electrically to the base portion 40a through a wiring pattern of the main FPC 41.

A plurality of, for example, four second connection pads 81b are provided on the second connecting portion 73b and arranged side by side in the longitudinal direction of the second connecting portion, that is, on the extension C of the line on which the first connection pads 81a are arranged. A ground pad 85b is provided side by side with the second connection pads 81b on the second connecting portion 73b. The second connecting portion 73b has a positioning hole 86b that is situated off the extension C of the line on which the second connection pads 81b are arranged and constitutes a second positioning portion. The second connection pads 81b and the ground pad 85b are connected electrically to the base portion 40a through the wiring pattern of the main FPC 41.

In the connecting portion 73 constructed in this manner, the first connecting portion 73a is bent at right angles to the extended end portion of the main FPC 41 along a broken line D1 shown in FIG. 11. The second connecting portion 73b is folded back at 180 degrees with the opposite end portions of the junction portion 73c bent along a broken line D2 of FIG. 11, whereby it is opposed substantially parallel to the first connecting portion 73a.

As shown in FIGS. 6 to 9 and FIG. 12, that surface of the first connecting portion 73a on the side opposite from the first connection pads 81a is fixed to the first support surface 67a of the support frame 62 with an adhesive agent 87, for example. In this case, the first connecting portion 73a is fixed in a predetermined position set with respect to the first support surface 67a with the positioning protrusion 68 of the support frame 62 passed through the positioning hole 86a. The coil connection pads 83 are, for example, soldered to the coil connection terminals 69 on the support frame 62 and connected electrically to the voice coil 64.

Figure 9:
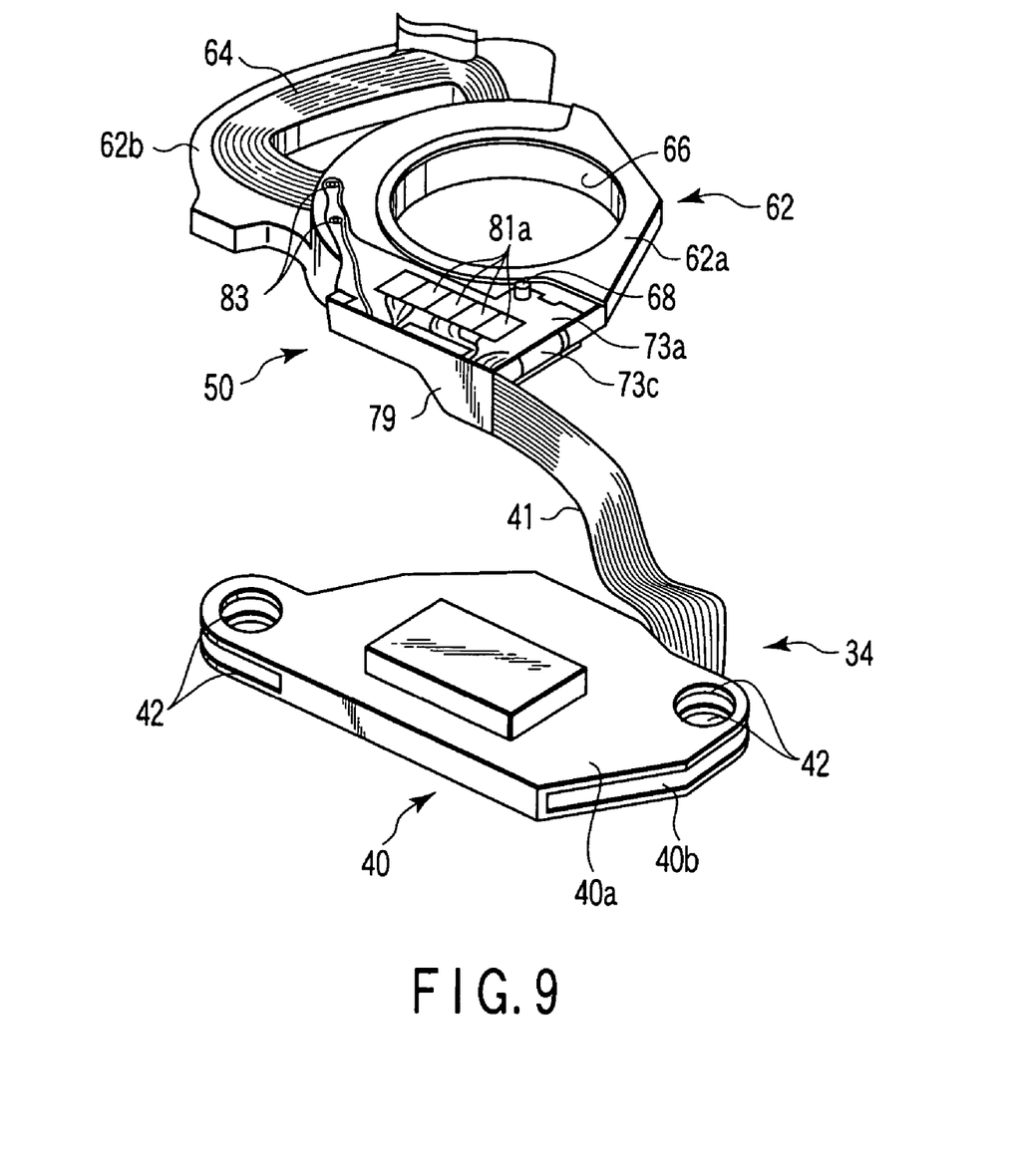
FIG. 9 is a perspective view showing a coil assembly of the head suspension assembly.
Figure 12:
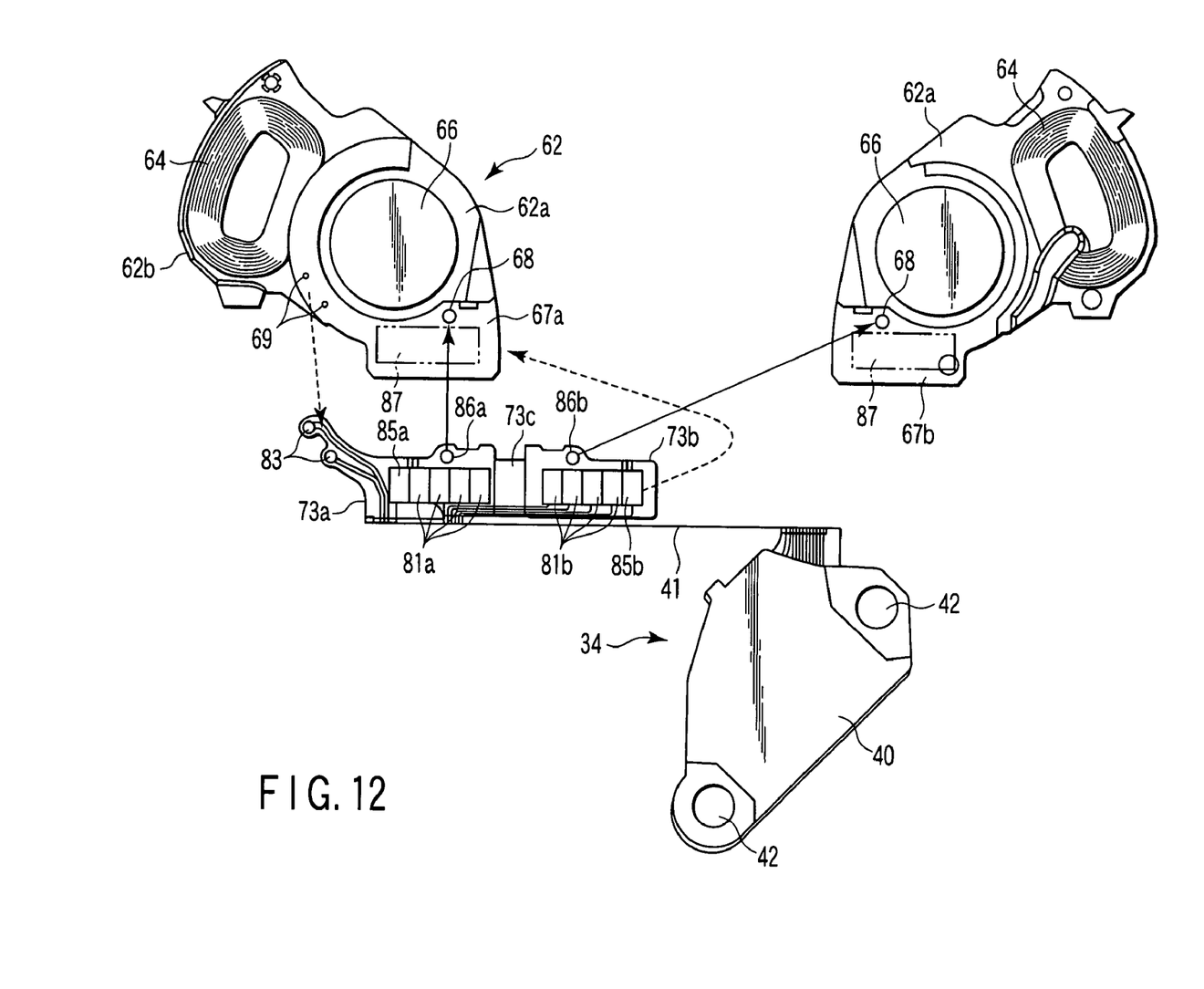
FIG. 12 is a plan view schematically showing a manufacturing process for the coil assembly.

That surface of the second connecting portion 73b on the side opposite from the second connection pads 81b is fixed to the second support surface 67b of the support frame 62 with the adhesive agent 87, for example. In this case, the second connecting portion 73b is fixed in a predetermined position set with respect to the second support surface 67b with the positioning protrusion 68 of the support frame 62 passed through the second positioning hole 86b.

Thus, the main FPC 41 of the board unit 34 and the support frame 62 are connected together to form the coil assembly 50.

The support frame 62 of the coil assembly 50 constructed in this manner and the HGAs 35a and 35b are laminated together as they are mounted on the hub 54 of the bearing assembly 52. More specifically, as shown in FIGS. 6 to 8, the arm 58 of the HGA 35a is fitted on the hub 54 in a manner such that hub is passed through the through hole 57, and is stacked on the flange 51 in the axial direction of the hub 54. The support frame 62 is stacked on the arm 58 of the HGA 35a as it is fitted on the hub 54 in a manner such that the hub is passed through the through hole 66. The arm 58 of the HGA 35b is stacked on the support frame 62 as it is fitted on the hub 54 in a manner such that the hub is passed through the through hole 57.

The pair of arms 58 fitted on the hub 54 and the support frame 62 situated between the arms are sandwiched between the flange 51 and a combination of a washer 89 and a nut 88 and fixedly held on the outer periphery of the hub. The washer 89 is fitted on the lower end portion of the hub 54, while the nut 88 is screwed on the threaded portion 55 of the hub. The arm 58 and the support frame 62 are located in positions relative to each other with respect to the circumferential direction of the hub 54. The HGAs 35a and 35b extend in the same direction from the hub 54 and face each other with a gap between them. The frame portion 62b of the support frame 62 extends in the direction opposite to that of the HGAs 35a and 35b.

The connecting end portion 61 of the relay FPC 59 that extends outward from the arm 58 of the HGA 35a is provided overlapping the first connecting portion 73a of the main FPC 41. The connection pads 65 provided on the connecting end portion 61 are fixed individually for electrical connection to the first connection pads 81a and the ground pad 85a of the first connecting portion 73a through an anisotropic conductive film 90, for example. Thus, the magnetic head 24 of the HGA 35a is connected electrically to the base portion 40a through the relay FPC 59 and the main FPC 41.

Likewise, the connecting end portion 61 of the relay FPC 59 that extends outward from the arm 58 of the HGA 35b is provided overlapping the second connecting portion 73b of the main FPC 41. The connection pads 65 provided on the connecting end portion 61 are fixed individually for electrical connection to the second connection pads 81b and the ground pad 85b of the second connecting portion 73b through another anisotropic conductive film 90, for example. The magnetic head 24 of the HGA 35b is connected electrically to the base portion 40a through the relay FPC 59 and the main FPC 41. The HSA 26 is formed in this manner.

The pair of arms 58 are situated overlapping the positioning protrusion 68 of the support frame 62 and the first and positioning holes 86a and 86b of the first and second connecting portions 73a and 73b. Thus, the connecting portions 73a and 73b are prevented from being disengaged or dislocated.

As clearly seen from FIGS. 2 and 3, the HSA 26 is located in the case 10 so that the bearing assembly 52 is fixed on a bottom wall of the first shell 10a. The board body 40 of the board unit 34 is fixed on the bottom of the first shell 10a by screwing. The voice coil 64 that is fixed to the support frame 62 is situated between a pair of yokes 63 that are fixed on the first shell 10a. It constitutes the VCM 28 in conjunction with the yokes 63 and a magnet (not shown) that are fixed to one of the yokes. The pair of HGAs 35a and 35b are situated on either surface side of the magnetic disk 20 so that the pair of magnetic heads 24 face each other with the disk between them. If the voice coil 64 is energized, the HSA 26 rocks between the retreated position shown in FIG. 3 and an operating position in which it is situated on the surface of the disk 20. Each magnetic head 24 can be located on a desired track of the disk 20. The solenoid latch 32 that is fixed to the first shell 10a serves to latch the HSA 26 that is moved to the retreated position. If the HDD is subjected to any external force such as a shock, the latch 32 can prevent the HSA 26 from moving from the retreated position to the operating position.

The ramp load mechanism 30 comprises a ramp member 70 and tabs 72. The ramp member 70 is fixed to the inner surface of the first shell 10a and faces the peripheral edge portion of the magnetic disk 20. The tabs 72 extend individually from the respective distal ends of the suspensions 60 and serve as engaging members. The ramp member 70 is formed by bending a plate material and has ramp surfaces 82 that can be engaged by the tabs 72. When the HSA 26 rocks from the inner peripheral portion of the magnetic disk 20 to the retreated position off the outer periphery of the disk, the tabs 72 engage the ramp surfaces 82, are then pulled up by the inclination of the ramp surfaces. Thereupon, the magnetic heads 24 are unloaded. When the HSA 26 rocks to the retreated position, the tabs 72 are supported on the ramp surfaces 82 of the ramp member 70, and the magnetic heads 24 are kept off the surfaces of the disk 20.

The following is a description of a manufacturing method for the HSA 26 described above.

The board unit 34 and the support frame 62 in which the voice coil 64 is embedded, as shown in FIG. 12, are prepared. Subsequently, the adhesive agent 87 is applied to the first and second support surfaces 67a and 67b of the support frame 62. The first connecting portion 73a of the main FPC 41 is pasted on the first support surface 67a with the adhesive agent 87. In doing this, the positioning protrusion 68 of the support frame 62 is passed through the positioning hole 86a of the first connecting portion 73a, whereby the first connecting portion 73a is positioned with respect to the first support surface 67a. After the second connecting portion 73b of the main FPC 41 is folded back, it is pasted on the second support surface 67b with the adhesive agent 87. In doing this, the positioning protrusion 68 of the support frame 62 is passed through the second positioning hole 86b of the second connecting portion 73b, whereby the second connecting portion 73b is positioned with respect to the second support surface 67b. The necessity of fixing protrusions can be obviated by fixing the first and second connecting portions 73a and 73b with the adhesive agent 87. Further, the coil connection pads 83 of the first connecting portion 73a are soldered individually to the coil connection terminals 69 of the support frame 62. Thus, the coil assembly 50 is formed.

Instead of using the adhesive agent, the first and second connecting portions 73a and 73b may be fixed to the support frame 62 by forming the positioning protrusion 68 of the support frame 62 from metal and soldering the connecting portions to the positioning protrusion.

Figure 13:
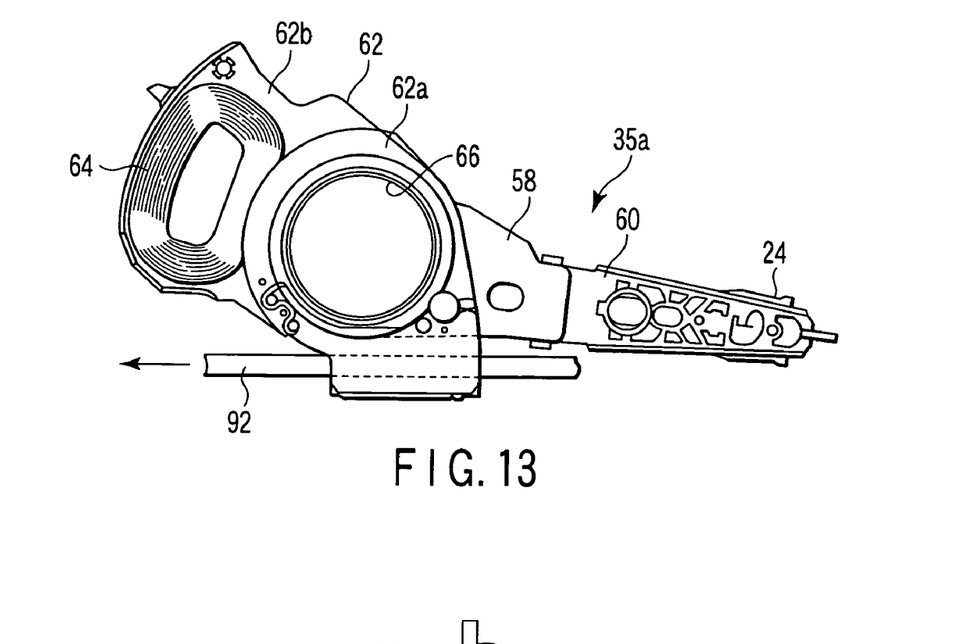
FIG. 13 is a plan view of the head suspension assembly showing a process for temporarily pressure-bonding anisotropic conductive films to the connecting portion of the coil assembly.
Figure 14:
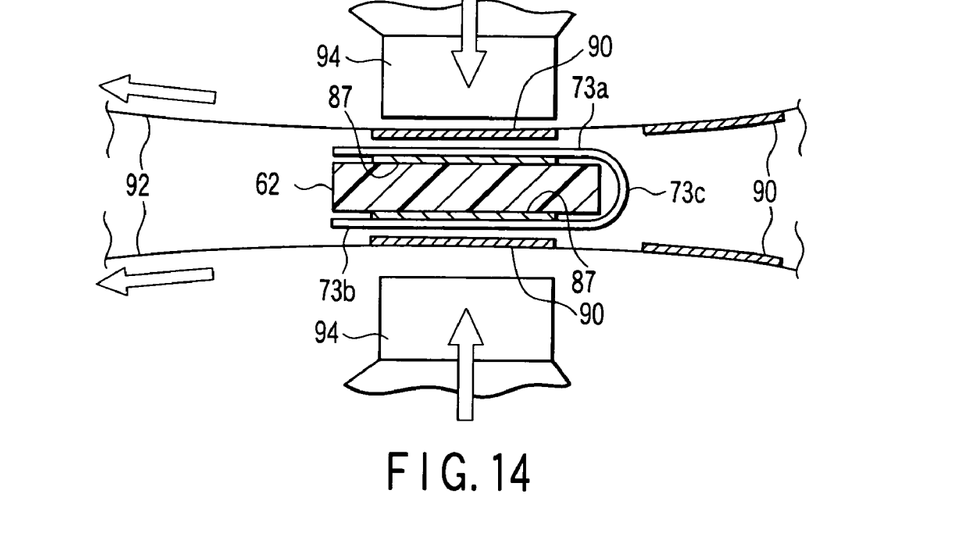
FIG. 14 is a sectional view of the connecting portion showing the process for temporarily pressure-bonding the anisotropic conductive films to the connecting portion of the coil assembly.

Then, as shown in FIGS. 13 and 14, a pair of ACF tapes 92 on which the anisotropic conductive films 90 are formed continuously or intermittently are prepared and located opposite first and second connecting portions 73a and 73b, individually. In doing this, the ACF tapes 92 are located individually in the directions of arrangement of the first and second connection pads 81a and 81b with respect to the first and second connecting portions 73a and 73b. Subsequently, the pair of ACF tapes 92, connecting portions 73a and 73b, and support frame 62 are held and pressurized from both sides of the tapes 92 and heated at a given temperature by heating heads 94. By doing this, the anisotropic conductive films 90 on the ACF tapes 92 are temporarily pressure-bonded to the first connection pads 81a and the ground pad 85a of the first connecting portion 73a and the second connection pads 81b and the ground pad 85b of the second connecting portion 73b.

Thereafter, the coil assembly 50 and the pair of HGAs 35a and 35b are fixed to the hub 54 of the bearing assembly 52. The connecting end portion 61 of the relay FPC 59 of the HGA 35a is located overlapping the first connecting portion 73a, and the connection pads 65 of the connecting end portion are opposed to the first connection pads 81a and the ground pad 85a with the anisotropic conductive film 90 between them. Likewise, the connecting end portion 61 of the relay FPC 59 of the HGA 35b is located overlapping the second connecting portion 73b, and the connection pads 65 of the connecting end portion are opposed to the second connection pads 81b and the ground pad 85b with the anisotropic conductive film 90 between them.

Figure 15:
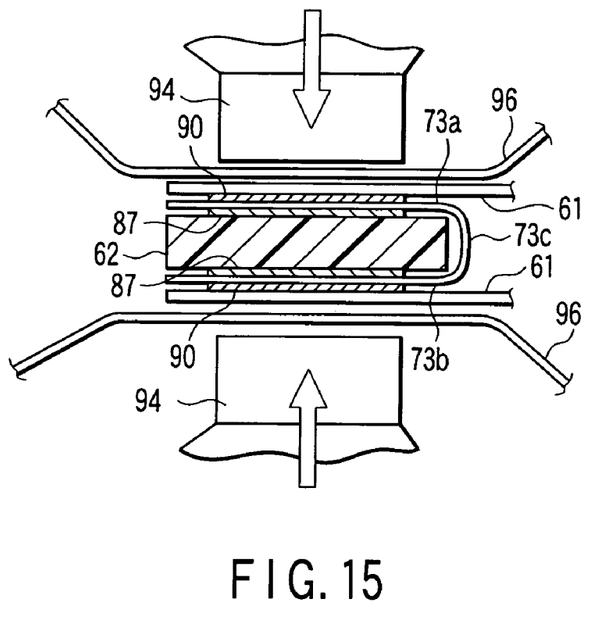
FIG. 15 is a sectional view of the connecting portion showing a process for connecting connecting end portions of head gimbals assemblies to the connecting portion of the coil assembly.

A pair of cushioning tapes 96 of, for example, Teflon (Trademark) are prepared and located opposite the connecting end portions 61, individually, as shown in FIG. 15. In doing this, the cushioning tapes 96 are located individually in the directions of arrangement of the first and second connection pads 81a and 81b with respect to the first and second connecting portions 73a and 73b. Subsequently, the pair of cushioning tapes 96, connecting end portions 61, connecting portions 73a and 73b, and support frame 62 are held and pressurized from both sides of the tapes 96 and heated at a given temperature by the heating heads 94. By doing this, the connection pads 65 of the connecting end portion 61 are heat/pressure-bonded to the first connection pads 81a and the ground pad 85a of the first connecting portion 73a with the anisotropic conductive film 90 between them. By this heat/pressure-bonding, the connection pads 65 of the connecting end portion 61 are connected electrically and mechanically to the first connection pads 81a of the first connecting portion 73a. At the same time, the connection pads 65 of the connecting end portion 61 are heat/pressure-bonded to the second connection pads 81b and the ground pad 85b of the second connecting portion 73b with the anisotropic conductive film 90 between them. By this heat/pressure-bonding, the connection pads 65 of the connecting end portion 61 are connected electrically and mechanically to the second connection pads 81b of the second connecting portion 73b.

As the cushioning tapes 96 are interposed in this manner, the connecting end portions 61 can be uniformly pressurized by the heating heads 94. Further, those parts of the anisotropic conductive films which are melted and projected can be caught by the cushioning tapes, whereby their adhesion can be prevented in the next process.

The HSA 26 is obtained in the processes described above.

According to the HDD and the HSA manufacturing method arranged in this manner, the connection pads are connected electrically to one another by interposing the anisotropic conductive films 90 between the connecting portion 73 of the main FPC 41 and the respective connecting end portions 61 of the relay FPCs 59 and heat/pressure-bonding the films form both sides. Thus, the main FPC 41 can be connected more easily and securely than in the conventional case where soldering or the like is used. If the small-sized HDD is provided with the two magnetic heads 24 for the magnetic disk 20, as in the present embodiment, the first and second connecting portions 73a and 73b of the main FPC 41 are fixed to the obverse and reverse surfaces of the support frame 62, i.e., the first and second support surfaces 67a and 67b, respectively, and also to the respective connecting end portions 61 of the relay FPCs 59. By doing this, a sufficient installation area can be secured for the connection pads, and connection work and individual repair of the magnetic heads can be performed efficiently.

In the first connecting portion 73a of the main FPC 41, the coil connection pads 83 are located on the voice coil side of the first connection pads 81a opposite from the junction portion 73c. Therefore, the wiring pattern of the main FPC 41 can be shortened, and each pad can be efficiency increased in size. Thus, position alignment or the like at the time of connection of the connecting portion can be performed with ease.

The connecting portion 73 of the main FPC 41 extends from one side edge of the distal end portion of the main FPC, and its first and second connecting portions 73a and 73b continuously extend in the longitudinal direction of the main FPC. The second connecting portion 73b is folded back at 180 degrees at the position of the junction portion 73c and faces the first connecting portion 73a with a gap between them. In this case, the connecting portions 73a and 73b can be opposed to each other at a space narrower than the width of the main FPC 41, thereby coping with the reduction of the thickness of the support frame 62 and the size of the HSA.

The respective positioning holes and coil connection pads of the connecting portions 73a and 73b are located off the extension of the direction of arrangement of the first and second connection pads 81a and 81b. In temporarily pressure-bonding the anisotropic conductive films 90, the ACF tapes are located in the direction of arrangement of the first and second connection pads. Since the coil connection pads, positioning holes, etc. are deviated from the direction of arrangement of the connection pads, however, the conductive films 90 can be accurately located on the connection pads without any interference. In the present embodiment, the first and second connecting portions 73a and 73b are fixed to the support frame with the adhesive agent, so that use of fixing protrusions can be omitted.

Likewise, in heat/pressure-bonding the connection pads on the main FPC side to the first and second connection pads 81a and 81b, the connection pads and the anisotropic conductive films can be bonded uniformly and securely by the heating heads 94 without the presence of any protrusions, such as the coil connection terminals 69, positioning protrusion 68, etc. In consequence, occurrence of connection failure can be prevented.

Thus, there may be provided the coil assembly, head suspension assembly, disk device, and head suspension assembly manufacturing method for miniaturization, in which the main FPC can be fixed and electrically connected with ease and reliability.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the diameter of the magnetic disk is not limited to 0.85 inch but may be 1.8 or 2.5 inches. In the first connecting portion of the main FPC, moreover, the position of the connection pads may be varied depending on the position of the coil connection terminals on the support frame side. For example, the coil connection pads may be provided on the head-side end portion of the first connecting portion. In this case, the second connecting portion extends from the coil-side end of the first connecting portion via the junction portion.

What is claimed is:

1. A coil assembly comprising:
   a support frame which has a first support surface and a second support surface opposed to each other and in which a voice coil is fixed; and
   a board unit having a base portion on which an electronic component is mounted, a belt-shaped main flexible printed circuit board extending from the base portion, and a connecting portion extending from one side of an extended end portion of the main flexible printed circuit board,
   the connecting portion including a first connecting portion which extends in a longitudinal direction of the main flexible printed circuit board and has a plurality of first connection pads arranged in the longitudinal direction, a junction portion extending from the first connecting portion, and a second connecting portion which extends in the longitudinal direction of the main flexible printed circuit board from the junction portion and has a plurality of second connection pads arranged in the longitudinal direction,
   the first connecting portion being fixed to the first support surface of the support frame, and the second connecting portion being folded back at the junction portion and fixed to the second support surface of the support frame.

2. The coil assembly according to claim 1, which further comprises coil connection terminals provided on the support frame and connected to the voice coil, and wherein the first connecting portion has coil connection pads which are located off an extension of a line on which the first connection pads are arranged and connected to the coil connection terminals.

3. The coil assembly according to claim 2, wherein the junction portion is located on the opposite side of the first connection pads from the coil connection pads.

4. The coil assembly according to claim 1, wherein the first connecting portion has a first positioning portion located off an extension of a line on which the first connection pads are arranged, the second connecting portion has a second positioning portion located off an extension of a line on which the second connection pads are arranged, the first support surface of the support frame has a first engaging portion which engages the first positioning portion of the first connecting portion and positions the first connecting portion, and the second support surface of the support frame has a second engaging portion which engages the second positioning portion of the second connecting portion and positions the second connecting portion.

5. The coil assembly according to claim 1, wherein the first and second connecting portions are adhesively bonded to the first and second support surfaces, respectively, of the support frame.

6. A head suspension assembly comprising:

a bearing portion;

a coil assembly having a support frame attached to the bearing portion, a voice coil fixed in the support frame, and a board unit connected to the support frame; and a first head gimbals assembly and a second head gimbals assembly attached to the bearing portion and opposed to each other with the support frame therebetween, the support frame of the coil assembly having a through hole through which the bearing portion is passed and a first support surface and a second support surface opposed to each other, the board unit having a base portion on which an electronic component is mounted, a belt-shaped main flexible printed circuit board extending from the base portion, and a connecting portion extending from one side of an extended end portion of the main flexible printed circuit board, the connecting portion including a first connecting portion which extends in a longitudinal direction of the main flexible printed circuit board and has a plurality of first connection pads arranged in the longitudinal direction, a junction portion extending from the first connecting portion, and a second connecting portion which extends in the longitudinal direction of the main flexible printed circuit board from the junction portion and has a plurality of second connection pads arranged in the longitudinal direction, the first connecting portion being fixed to the first support surface of the support frame, and the second connecting portion being folded back at the junction portion and fixed to the second support surface of the support frame, the first head gimbals assembly including an arm which has a proximal end portion with a through hole through which the bearing portion is passed and extends from the bearing portion, a suspension extending from an extended end of the arm, a head mounted on an extended end of the suspension, and a relay flexible printed circuit board which is mounted on the arm and the suspension and has one end portion connected electrically to the head, a connecting end portion extending from the proximal end portion of the arm and lapped on the first connecting portion, and a plurality of connection pads provided on the connecting end portion and connected to the first connection pads, the second head gimbals assembly including an arm which has a proximal end portion with a through hole through which the bearing portion is passed and extends from the bearing portion, a suspension extending from an extended end of the arm, a head mounted on an extended end of the suspension, and a relay flexible printed circuit board which is mounted on the arm and the suspension and has one end portion connected electrically to the head, a connecting end portion extending from the proximal end portion of the arm and lapped on the second connecting portion, and a plurality of connection pads provided on the connecting end portion and connected to the second connection pads.

7. The head suspension assembly according to claim 6, which further comprises coil connection terminals provided on the support frame and connected to the voice coil, and wherein the first connecting portion has coil connection pads which are located off an extension of a line on which the first connection pads are arranged and connected to the coil connection terminals.

8. The head suspension assembly according to claim 7, wherein the junction portion is located on the opposite side of the first connection pads from the coil connection pads.

9. The head suspension assembly according to claim 6, wherein the first connecting portion has a first positioning portion located off an extension of a line on which the first connection pads are arranged, the second connecting portion has a second positioning portion located off an extension of a line on which the second connection pads are arranged, the first support surface of the support frame has a first engaging portion which engages the first positioning portion of the first connecting portion and positions the first connecting portion, the second support surface of the support frame has a second engaging portion which engages the second positioning portion of the second connecting portion and positions the second connecting portion, and the first and second positioning portions are interposed between the respective arms of the first and second head gimbals assemblies.

10. The head suspension assembly according to claim 6, wherein the connection pads provided on the relay flexible circuit board of the first head gimbals assembly are connected to the first connection pads by an anisotropic conductive film, and the connection pads provided on the relay flexible circuit board of the second head gimbals assembly are connected to the second connection pads by another anisotropic conductive film.

11. A disk device comprising:

a case;

a disk-shaped recording medium located in the case;

a drive motor which is located in the case and supports and rotates the recording medium; and a head suspension assembly according to claim 6 located in the case.

12. A method of manufacturing a head suspension assembly, which comprises a bearing portion, a coil assembly having a support frame attached to the bearing portion, a voice coil fixed in the support frame, and a board unit connected to the support frame, and a first head gimbals assembly and a second head gimbals assembly attached to the bearing portion and opposed to each other with the support frame therebetween, the support frame of the coil assembly having a through hole through which the bearing portion is passed and a first support surface and a second support surface opposed to each other, the board unit having a base portion on which an electronic component is mounted, a belt-shaped main flexible printed circuit board extending from the base portion, and a connecting portion extending from one side of an extended end portion of the main flexible printed circuit board, the connecting portion comprising a first connecting portion which extends in a longitudinal direction of the main flexible printed circuit board and has a plurality of first connection pads arranged in the longitudinal direction, a junction portion extending from the first connecting portion, and a second connecting portion which extends in the longitudinal direction of the main flexible printed circuit board from the junction portion and has a plurality of second connection pads arranged in the longitudinal direction, the first connecting portion being fixed to the first support surface of the support frame, and the second connecting portion being folded back at the junction portion and fixed to the second support surface of the support frame, the first head gimbals assembly comprising an arm which has a proximal end portion with a through hole through which the bearing portion is passed and extends from the bearing portion, a suspension extending from an extended end of the arm, a head mounted on an extended end of the suspension, and a relay flexible printed circuit board which is mounted on the arm and the suspension and has one end portion connected electrically to the head, a connecting end portion extending from the proximal end portion of the arm and lapped on the first connecting portion, and a plurality of connection pads provided on the connecting end portion and connected to the first connection pads, the second head gimbals assembly comprising an arm which has a proximal end portion with a through hole through which the bearing portion is passed and extends from the bearing portion, a suspension extending from an extended end of the arm, a head mounted on an extended end of the suspension, and a relay flexible printed circuit board which is mounted on the arm and the suspension and has one end portion connected electrically to the head, a connecting end portion extending from the proximal end portion of the arm and lapped on the second connecting portion, and a plurality of connection pads provided on the connecting end portion and connected to the second connection pads, the method comprising:

- adhesively bonding the first and second connecting portions of the main flexible printed circuit board to the first and second support surfaces, respectively, of the support frame;
- connecting the voice coil to the first connecting portion;
- superposing anisotropic conductive films on the first connection pads of the first connecting portion and the second connection pads of the second connecting portion;
- mounting the first and second head gimbals assemblies and the support frame on the bearing portion;
- superposing the connecting end portion of the relay flexible printed circuit board of the first head gimbals assembly and the connecting end portion of the relay flexible printed circuit board of the second head gimbals assembly on the first connecting portion and the second connecting portion, respectively; and
- heat/pressure-bonding the connecting end portion of the relay flexible printed circuit board of the first head gimbals assembly and the connecting end portion of the relay flexible printed circuit board of the second head gimbals assembly to the first connecting portion and the second connecting portion, respectively, with the anisotropic conductive films therebetween.

13. The method of manufacturing a head suspension assembly according to claim 12, wherein the connecting end portion of the relay flexible printed circuit board of the first head gimbals assembly and the connecting end portion of the relay flexible printed circuit board of the second head gimbals assembly are held from both sides and heat/pressure-bonded simultaneously.

* * * * *